Figure 1:
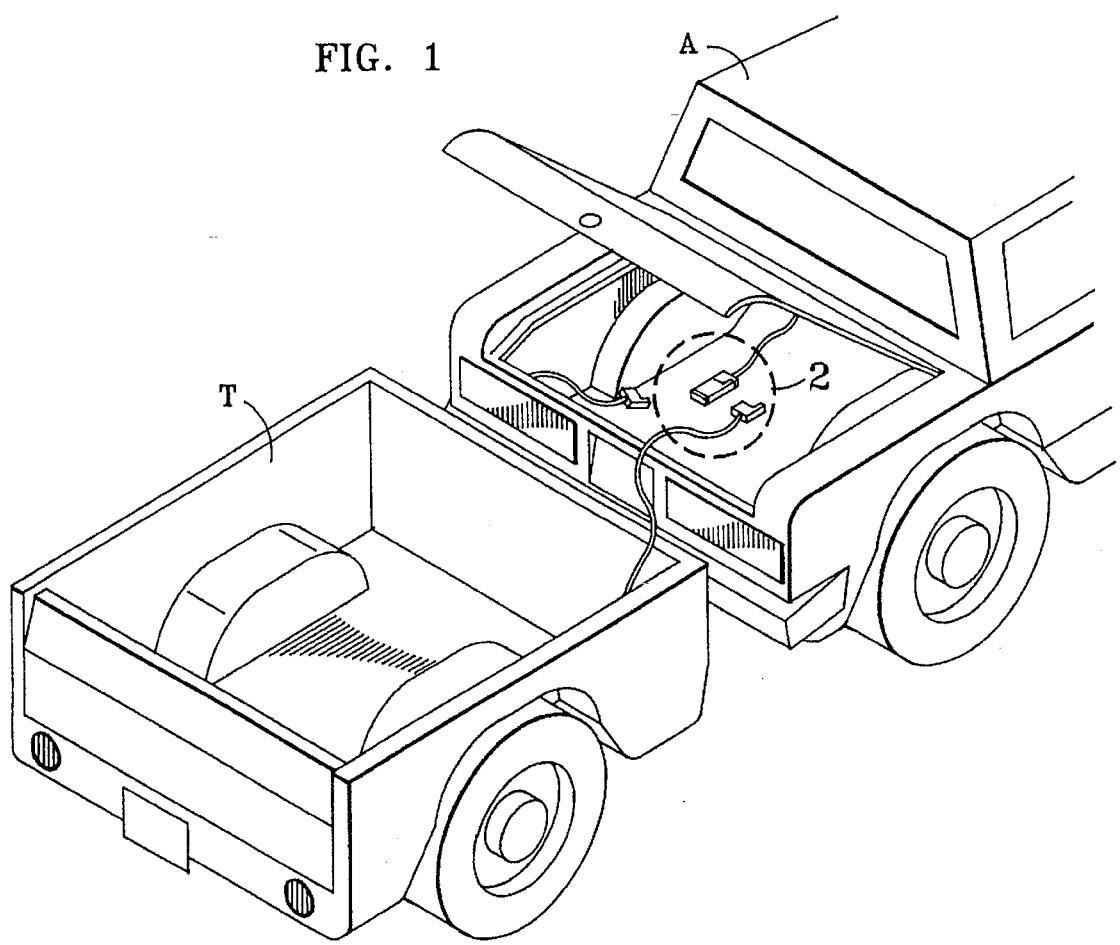

United States Patent [19]

Borland

[11] Patent Number: 5,635,843

[45] Date of Patent: Jun. 3, 1997

[54] AUTO HARNESS INTEGRITY TESTER

[76] Inventor: Leslie R. Borland, 43 Saranac Ave., Lake Placid, N.Y. 12946

[21] Appl. No.: 441,412

[22] Filed: May 15, 1995

[51] Int. Cl.[6] .................................................. G01R 31/02
[52] U.S. Cl. ........................... 324/504; 324/556; 324/133; 324/542
[58] Field of Search ..................................... 324/133, 556, 324/511, 542, 503, 504

[56] References Cited

U.S. PATENT DOCUMENTS

| | | | |
|---|---|---|---|
| 2,622,214 | 12/1952 | Bronson | 324/556 |
| 3,467,867 | 9/1969 | Armes et al. | 324/511 |
| 4,155,036 | 5/1979 | Nicholson | 324/511 |
| 4,162,478 | 7/1979 | Huber et al. | 324/133 |
| 4,166,242 | 8/1979 | Spiteri | 324/133 |
| 4,843,326 | 6/1989 | Smythe | 324/556 |
| 4,945,760 | 8/1990 | Hornung | 324/133 |
| 5,319,312 | 6/1994 | Segilia | 324/556 |
| 5,359,290 | 10/1994 | Cervas | 324/556 |
| 5,416,421 | 5/1995 | Doland | 324/556 |

*Primary Examiner*—Kenneth A. Wieder
*Assistant Examiner*—Jose M. Solis
*Attorney, Agent, or Firm*—John J. Welch, Jr., Esq.

[57] ABSTRACT

An auto harness integrity tester the components of which are respectively a housing unit protectively holding three male prongs extending from holes in one end thereof adjacent a female socket pocket in this end of the housing unit with wiring running from the prongs, one at a time to one each of three resistors and wiring running from each resistor to one each of three light emitting diodes from each of which a wire leads to a common wire leading to the female socket pocket such that when the instant device is plugged into the end plug of an auto harness, current can run from the harness through the prongs to the diodes and via a prong in the end plug received by the female socket pocket to ground.

11 Claims, 3 Drawing Sheets

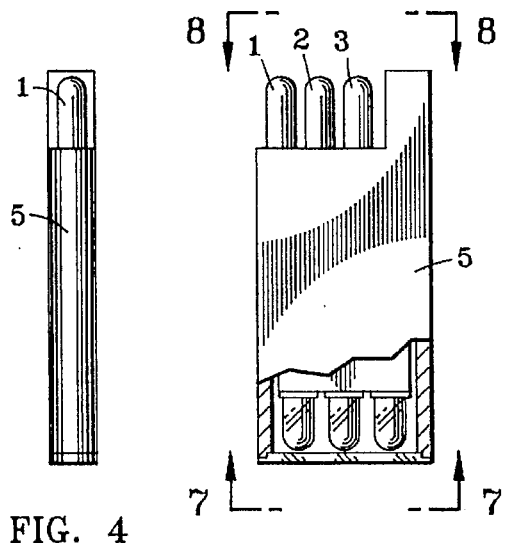
FIG. 4
FIG. 5
FIG. 6
FIG. 7
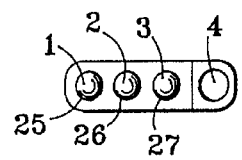
FIG. 8
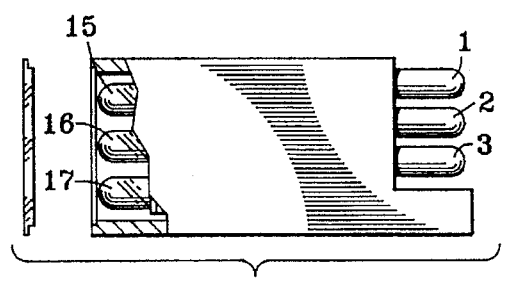
FIG. 9
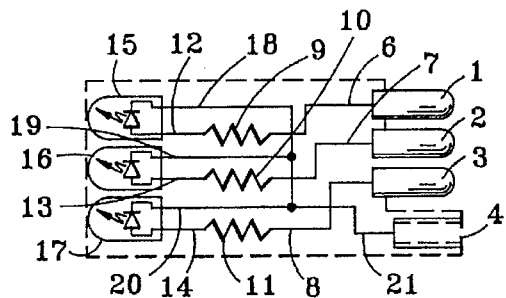
FIG. 10
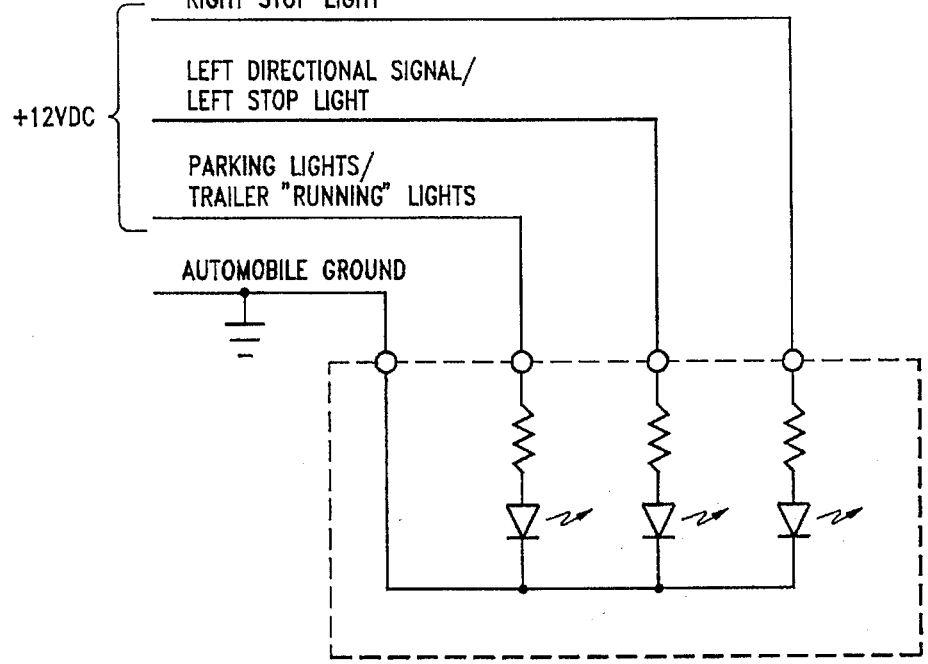
FIG. 11

AUTO HARNESS INTEGRITY TESTER

CROSS REFERENCE TO PRIOR APPLICATIONS

There are no prior or parent applications related to the instant application or invention.

FEDERALLY SPONSORED RESEARCH AND DEVELOPMENT

There is no federally sponsored research and development related to the instant invention.

BACKGROUND OF THE INVENTION

1. Field of the Invention

The instant invention related to that class of devices that serve to test conductivity of wiring in vehicles where such wiring via a harness unit, so-called ultimately connects a power source within such vehicles to the rear lights on trailer vehicles amenable to being towed by such vehicles.

2. Prior Art

The following references are to be found within the particular field of the instant invention, but the claims and specifications set forth therein do not anticipate those that are endemic to the instant invention:

| Inventor | Invention | Patent No. | Date |
|---|---|---|---|
| Whisenand | Electrical Tester with Electrical Energizable Test Probe | 5,367,250 | 11/22/94 |
| Jeter | Trailer Light Convertor | 4,781,393 | 11/1/88 |
| Schneider, III | Compact Lamp and Circuit Tester for Vehicles, Particularly Automobiles | 5,278,511 | 1/11/94 |
| Liu et al. | Portable Apparatus for Testing Multi-Wire Harnesses and Electrical Assemblies to Identify Wiring Errors | 5,250,908 | 10/5/93 |
| Lemon | Apparatus for Determining Wiring Orientation at Electrical Connectors Including Plural Light Indicators and Rotary Switch | 5,192,912 | 3/9/93 |
| McConchie Sr. | Diagnostic Test Apparatus for Electrical System of Automotive Vehicle | 4,884,033 | 11/28/89 |
| Butchko | Vehicle Light Testing System for Testing a Plurality of Lights Using a Scanning Sequence | 4,866,390 | 9/12/89 |

A SUMMARY OF THE INVENTION

1. A Brief Description of the Invention:

The instant invention for a first embodiment consists of three male prongs emanating out of the bottom of a small housing unit amenable to being easily hand held. Within the housing unit are three wires connected one each respectively to one each of the three prongs. Each one of the wires leads one each from a prong to a resistor for each wire and then from each resistor another piece of wiring leads to one each of three small light emitting diodes from each of which wiring leads to a fourth common wire which leads to a female socket pocket adjacent the three male prongs amenable to receipt of an exterior male prong located on a typical auto harness end plug. All of the foregoing components are located in and within the small housing unit with the exception of, as noted above, portions of the three outwardly extending male prongs. The three light emitting diodes are located at the end of the housing unit opposite the end where the three male prongs and the female socket pocket are located. Typically, the diode end is transparent as well as being closed. Another variant of this embodiment is one wherein the bulbous portions of the light emitting diodes are exposed to the outside air with there being no closed transparent diode end of the small housing unit and with the diodes all simply affixed in place within the housing unit.

When the three male prongs are received by female socket pockets in the auto harness end plug connected to an auto harness typically found in the trunk of a car and concomitantly the invention's female socket adjacent the three male prongs receives a male prong in the auto harness end plug adjacent the end plug's three female socket pockets, then, three circuits exist such that when a 9.5 to 16.0 volt power source is activated within the car, current flows via appropriate switching through the wiring within the housing unit through the resistors one at a time as each circuit is activated thereby lighting one light emitting diode per activated circuit and then such current runs to ground via the wiring within the housing unit leading from such lit diodes to the above-noted common wiring leading to the invention's female socket pocket and to the above-mentioned harness end plug's male prong plugged therein from which wiring within the end plug itself runs via the harness to effective ground. One light emitting diode circuit system accepts current via wiring in the auto harness that corresponds to the automobile's right rear braking and directional light system. A second light emitting diode circuit system accepts current via wiring in the auto harness that corresponds to the automobile's left rear braking and directional light system. The third light emitting diode circuit system accepts current via wiring in the auto harness that corresponds to the automobile's rear parking and running light system. If one of these circuit system is activated but the corresponding light emitting diode does not light up, then, one knows that there is a problem within that portion of the auto harness that corresponds to that rear lighting system within the auto sought to be examined via the harness assuming that system on the car is seen to work properly when the harness circuits are not activated by way of resort to the invention. A second embodiment with either a closed, transparent or an open diode end is one wherein the three resistors lie between the diodes and ground rather than between the prongs and the diodes.

2. Objects of the Invention

It is inconvenient and time consuming to be required to walk behind a trailer vehicle being hauled by an automobile to check to see if its rear running and, parking lights and then right rear braking and directional lights and left rear braking and directional lights are working and upon observing failure in either one or more these systems to then be required to ascertain via continuing walking around and inspecting whether such failure is due to failure within the auto or auto harness or within the bulbs or wiring of the trailer vehicle itself. Invariably, diagnosis in any such event requires an unhooking of the trailer vehicle from the automobile and a rechecking of the above-mentioned systems within the auto itself. And, even then, such an undertaking will not reveal whether a failure is due to a problem within the auto itself or instead within only the auto's harness. However, utilization of the instant invention will very quickly and expeditiously enable one to ascertain whether there are auto or harness problems with respect to such systems. Before hooking a trailer vehicle to an auto, one can simply check to see if all three such systems on the auto are working by viewing the taillights of the auto as the appropriate activation switches relating to each are turned on, then off. Once it is clear that all such system are properly working, then, the instant invention can be plugged into the auto harness end plug and the appropriate activation switches can again be turned on one at a time actuating one light emitting diode per system at a time. Once this has been done and it is clear that all such system via the harness are operable, then, the systems plug that corresponds to the rear light systems in the trailer vehicle can be plugged into the end plug of the auto harness and the appropriate activation switches can be turned on one at a time to discern via one walk around inspection only operability of the corresponding lighting systems in the rear of the trailer vehicle.

Respectfully submitted, the instant invention is a small, handy, very simple, uniquely inexpensive device that facilitates quick and ready diagnosis of the actual source of any such rear light systems problem should there prove to be one and as such constitutes a rather marked departure from the art regarding such devices.

A DESCRIPTION OF THE DRAWINGS

1. FIG. 1 shows an auto with its auto harness within its trunk space prominently displayed with the auto hooked to a trailer vehicle within which there is seen the trailer's end plug unit.

Figure 2:
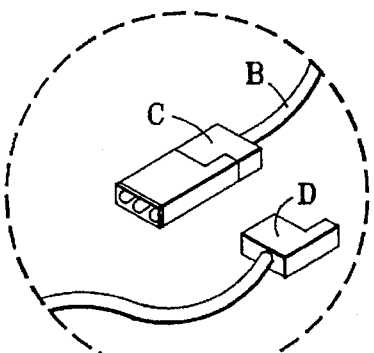

2. FIG. 2 is an isolated view of the auto harness end plug shown in FIG. 1 in receipt of the instant invention and in apposition to, as seen in FIG. 1, the trailer vehicle end plug unit seen in FIG. 1.

Figure 3:
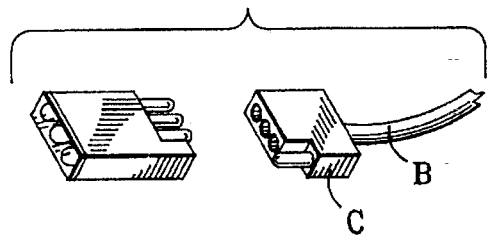

3. FIG. 3 is an isolated plan view of the instant invention in apposition only to an auto harness end plug.

4. FIG. 4 is a left lateral plan view of the instant invention.

5. FIG. 5 is a broken front view of the instant invention showing the lie of its three light emitting diodes within its housing unit component.

6. FIG. 6 is a right lateral plan view of the instant invention.

7. FIG. 7 is a top plan view of the instant invention's three light emitting diodes.

8. FIG. 8 is a bottom plan view of the instant invention.

9. FIG. 9 is a plan view of the instant invention showing the diode end of its housing unit component as being open to the outside air.

10. FIG. 10 is a broken view of what is seen in FIG. 9 showing the wiring and other components of one embodiment of the instant invention within its housing unit.

11. FIG. 11 is a schematic drawing of the electronic essence of the embodiment of the instant invention as depicted in FIG. 10.

Figure 12:
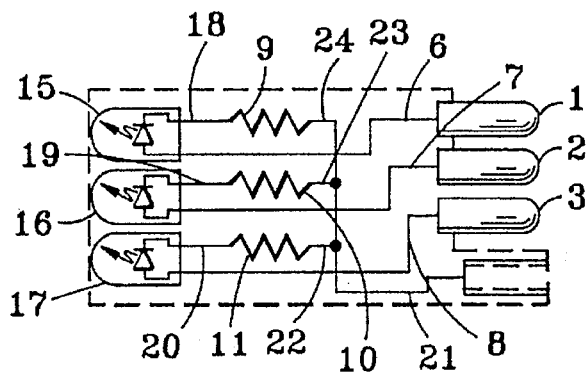

12. FIG. 12 is a broken view of what is seen in FIG. 9 showing the wiring and other components of another embodiment of the instant invention within its housing unit.

Figure 13:
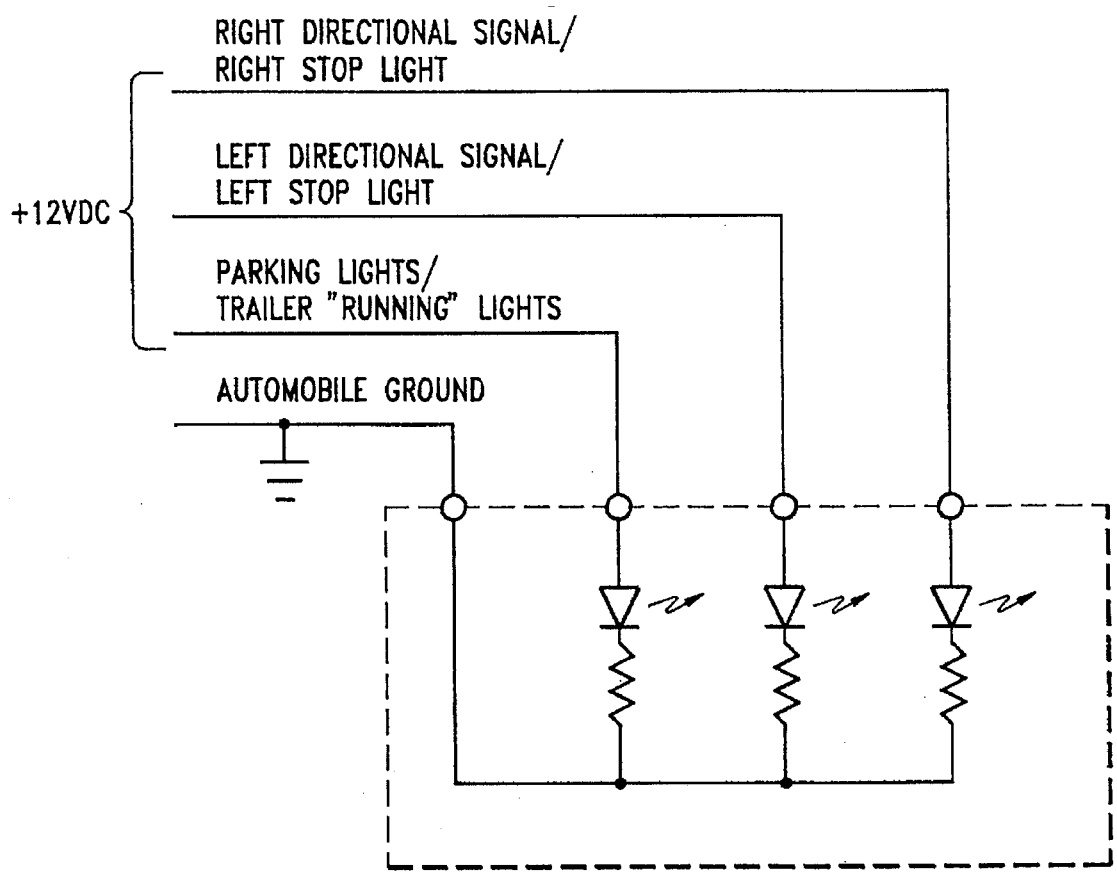

13. FIG. 13 is schematic drawing of the electronic essence of the embodiment of the instant

A DESCRIPTION OF THE PREFERRED EMBODIMENTS

FIG. 1 shows an auto A to which there has been hooked a trailer vehicle T. Within the open trunk of auto A, one can see an auto harness B to the end plug C of which the instant invention has been plugged all in apposition to a trailer vehicle end plug D. A close up view of harness B's end plug C holding the instant invention in proximity to plug D is seen in FIG. 2. FIG. 3 shows the instant invention in close proximity to a harness B's end plug C. Whether the rear running lights, rear parking lights or rear braking lights or rear directional lights of a trailer T are working depends on whether the wiring within trailer T leading to the lights from its plug D plugged into plug C is properly functional along with, of course, its rear light bulbs and upon whether the wiring in harness B is properly functional as well as upon whether the power source within auto A leading to such wiring is also properly functioning. The instant invention when plugged into end plug C enables one to quickly discern the existence of a power output problem or not within harness B up to the point of end plug C assuming that the corresponding lights in auto A when the invention is not plugged into end plug C are initially in proper working order upon inspection. In this way, if after all is said and done, there is no problem, but there is nevertheless a problem evident from only a solitary inspection of the rear lights of trailer T only after plugging end plug D into end plug C, then, one is able to instantly ascertain that such a problem exists from the locus of end plug D back to the rear lights of trailer T. Such a facility for diagnosis by virtue of utilization of the instant invention greatly reduces erstwhile inconvenience as regards otherwise necessary additional diagnostic inspection of the rear of trailer T as one, once having ascertained the existence of a problem with respect to the rear lights of trailer T, would then need to so otherwise discern whether such a problem is within auto A somewhere or perhaps within harness B somewhere or perhaps within trailer T somewhere.

The instant invention for a first embodiment consists of three identical male prongs, prong 1, prong 2 and prong 3 adjacent one another and laterally adjacent to one of all of which there is a female socket pocket 4 all located at one end of the instant invention. Socket pocket 4 is contained within an opening within a housing component 5 which houses and protects all of the various other component parts of the instant invention. Prongs 1, 2 and 3 each extend an equal distance out of holes, 25, 26 and 27, one hole per prong in the bottom of housing 5 and are fastened respectively in place to the inner perimeters of holes 25, 26 and 27. As seen in FIG. 10, prong 1 leads to and is connected to wire 6 which leads to and is connected to resistor 9 which leads to and is connected to wire 12 which leads to and is connected to light emitting diode 15. Prong 2 leads to and is connected to wire 7 which leads to and is connected to resistor 10 which leads to and is connected to wire 13 which leads to and is connected to light emitting diode 16. Prong 3 leads to and is connected to wire 8 which leads to and is connected to resistor 11 which leads to and is connected to wire 14 which leads to and is connected to light emitting diode 17. Wire 18 leads from light emitting diode 15 to connect with wire 21 which leads to socket pocket 4 in receipt of the solitary male plug of end plug C. Wire 19 also leads from light emitting diode 16 to connect with wire 21. Wire 20 as well leads from light emitting diode 17 to connect with wire 21. FIG. 11 is a schematic depiction of what is seen in FIG. 10. In respect of this embodiment, the end of housing component 5 where the bulbous portions of light emitting diodes 15, 16 and 17 are found, which is opposite the end where prongs 1, 2 and 3 are found, is closed and transparent. However, this diode end could easily be open with the bulbous portions of diodes 15, 16 and 17 exposed to the outside air as can be noted with reference to FIG. 9. FIG. 12 is a depiction of a second embodiment of the instant invention wherein resistors 9, 10 and 11 lie between light emitting diodes 15, 16 and 17 and wire 21 rather than between prongs 1, 2 and 3 respectively and diodes 15, 16 and 17. In this embodiment, wires 6, 7 and 8 respectively lead from prongs 1, 2 and 3 fastened as with regards to the above-noted embodiment to the inner perimeters of holes 25, 26 and 27, and wires 18, 19 and 20 run respectively from diodes 15, 16 and 17 to connect up respectively with resistors 9, 10 and 11 with wires 22, 23 and 24 connected to and running respectively from resistors 9, 10 and 11 to connect with wire 21. FIG. 13 is a schematic depiction of what is seen in FIG. 12. As respects this embodiment, the diode end could just as with the prior embodiment be either closed and transparent or simply open Resistors 9, 10 and 11 connected in series to light emitting diodes 15, 16 and 17 respectively must possess enough resistivity to prevent damage to the diodes from current flowing from a power source within auto A during moments of peak power output such, as, for example, when testing might be being undertaken in the unlikely event that the engine of auto A is, at the same time being rowed up while in neutral with the brake engaged and yet possess not such much resistivity that current sufficient to light the diodes is unable to flow during moments of minimal power output as, for example when testing is being undertaken with the engine being off. The voltage drop between the power source in auto A and effective ground within the range of the above-noted two examples is somewhere between 9.5 volts when Auto A is not only not running but indeed is being tested while its engine is being effectively cranked to get started to 16 volts as, for example, when testing is occurring while the engine of Auto A is running and being revved up. The maximum current carrying capacity of diodes 15, 16 and 17 is of the order of 20 milliamps and the optoelectric current carrying capability required to light diode 15 or 16 or 17 is of the order of 10 milliamps. Hence, each resistor must possess resistivity of at least roughly 0.75 kilohms to one kilohm, and whereas, in the vast majority of instances, testing will occur with the engine of Auto A off where the voltage drop would be roughly 12.5 volts assuming a good battery in Auto A, then, each resistor should possess resistivity of roughly 1.25 kilohms. In short, once the instant invention is plugged into end plug C and, for example, the right rear directional light switch in auto A is activated, the corresponding diode connected ultimately to the pocket socket in end plug C that via harness B is ultimately connected to the right rear directional switch system in auto A will light up. If it does not, then assuming that the right rear directional light of the car operated properly when switched on before the instant invention was plugged into end plug C, one would instantly know that there was an electrical problem as between the switching system and harness B leading to end plug C. The same would hold true as respects the left rear directional light system of auto A as well as with respect to the braking, running and parking light system of auto A. Different colored diodes 15, 16 and 17 respectively red, yellow and green could help serve to enable any user of the instant invention to ascertain which auto A rear light system via harness B was with respect to harness B currently not operable.

In closing, respectfully submitted, the instant invention represents a marked departure from the current art regarding similar devices in view of its inherent simplicity and ease of use that operate to render it indeed new, useful and unique.

What is claimed is:

1. An auto harness integrity tester, comprising:
   a. a housing unit with three collinear holes in one end side of said housing unit with the other end of said housing unit being closed and transparent;
   b. a female socket pocket hole in said one end side adjacent only one of said three holes and collinear with said three holes;
   c. a first male prong extending from within said housing unit through a first one of said three holes and fastened in place where said first prong so extends through said first hole;
   d. a second male prong extending from within said housing unit through a second one of said three holes and fastened in place where said second prong so extends through said second hole;
   e. a third male prong extending from within said housing unit through a third one of said three holes and fastened in place where said third prong so extends through said third hole;
   f. a first wire within said housing unit and connected to the end of said first prong located inside said housing unit;
   g. a second wire within said housing unit and connected to the end of said second prong located inside said housing unit;
   h. It a third wire within said housing unit and connected to the end of said third prong located inside said housing unit;
   i. said first wire connected to a first end of a first resistor located within said housing unit;
   j. said second wire connected to a first end of a second resistor located within said housing unit;
   k. said third wire connected to a first end of a third resistor located within said housing unit;
   l. a fourth wire located within said housing unit and connected to a second end of said first resistor;
   m. a fifth wire located within said housing unit and connected to a second end of said second resistor;
   n. a sixth wire located within said housing unit and connected to a second end of said third resistor;
   o. said fourth wire connected to a first end of a first light emitting diode located within and internally fastened within and to said housing unit;
   p. said fifth wire connected to a first end of a second light emitting diode located within and internally fastened within and to said housing unit;
   q. said sixth wire connected to a first end of a third light emitting diode located within and internally fastened within and to said housing unit;
   r. a seventh wire located within said housing unit connected to said first light emitting diode;
   s. an eighth wire located within said housing unit connected to said second light emitting diode;
   t. a ninth wire located within said housing unit connected to said third light emitting diode;
   u. said seventh wire connected to a tenth wire;
   v. said eighth wire connected to said tenth wire;
   w. said ninth wire connected to said tenth wire;
   x. said tenth wire connected to a metallic base of said female pocket socket;
   y. said resistors all characterized by resistivity of 1.0 kilohms;
   z. said light emitting diodes all characterized by optoelectric current carrying capacity of 10 milliamps.

2. An auto harness integrity tester, comprising:
   a. a housing unit with three collinear holes in one end side of said housing unit with the other end of said housing unit being closed and transparent;
   b. a female socket pocket hole in said one end side adjacent only one of said three holes and collinear with said three holes;
   c. a first male prong extending from within said housing unit through a first one of said three holes and fastened in place where said first prong so extends through said first hole;

d. a second male prong extending from within said housing unit through a second one of said three holes and fastened in place where said second prong so extends through said second hole;
e. a third male prong extending from within said housing unit through a third one of said three holes and fastened in place where said third prong so extends through said third hole;
f. a first wire within said housing unit and connected to the end of said first prong located inside said housing unit;
g. a second wire within said housing unit and connected to the end of said second prong located inside said housing unit;
h. a third wire within said housing unit and connected to the end of said third prong located inside said housing unit;
i. said first wire connected to a first end of a first light emitting diode located within and internally fastened within and to said housing unit;
j. said second wire connected to a first end of a second light emitting diode located within and internally fastened within and to said housing unit;
k. said third wire connected to a first end of a third light emitting diode located within and internally fastened within and to said housing unit;
l. a fourth wire connected to and leading from said first light emitting diode to a first end of a first resistor located within said housing unit;
m. a fifth wire connected to and leading from said second light emitting diode to a first end of a second resistor located within said housing unit;
n. a sixth wire connected to and leading from said third light emitting diode to a first end of a third resistor located within said housing unit;
o. a seventh wire located within said housing unit connected to and leading from said first resistor to and connected with a tenth wire;
p. an eighth wire located within said housing unit connected to and leading from said second resistor to and connected with a tenth wire;
q. a ninth wire located within said housing unit connected to and leading from said third resistor to and connected with a tenth wire;
r. said tenth wire connected to a metallic base of said female pocket socket;
s. said resistors all characterized by resistivity of 1.0 kilohms;
t. said light emitting diodes all characterized by optoelectric current carrying capacity of 10 milliamps.

3. An auto harness integrity tester, comprising:
a. a housing unit with three collinear holes in one end side of said housing unit with the other end of said housing unit being open;
b. a female socket pocket hole in said one end side adjacent only one of said three holes and collinear with said three holes;
c. a first male prong extending from within said housing unit through a first one of said three holes and fastened in place where said first prong so extends through said first hole;
d. a second male prong extending from within said housing unit through a second one of said three holes and fastened in place where said second prong so extends through said second hole;
e. a third male prong extending from within said housing unit through a third one of said three holes and fastened in place where said third prong so extends through said third hole;
f. a first wire within said housing unit and connected to the end of said first prong located inside said housing unit;
g. a second wire within said housing unit and connected to the end of said second prong located inside housing unit;
h. a third wire within said housing unit and connected to the end of said third prong located inside said housing unit;
i. said first wire connected to a first end of a first resistor located within said housing unit;
j. said second wire connected to a first end of a second resistor located within said housing unit;
k. said third wire connected to a first end of a third resistor located within said housing unit;
l. a fourth wire located within said housing unit and connected to a second end of said first resistor;
m. a fifth wire located within said housing unit and connected to a second end of said second resistor;
n. a sixth wire located within said housing unit and connected to a second end of said third resistor;
o. said fourth wire connected to a first end of a first light emitting diode located within and internally fastened within and to said housing unit;
p. said fifth wire connected to a first end of a second light emitting diode located within and internally fastened within and to said housing unit;
q. said sixth wire connected to a first end of a third light emitting diode located within and internally fastened within and to said housing unit;
r. a seventh wire located within said housing unit connected to said first light emitting diode;
s. an eighth wire located within said housing unit connected to said second light emitting diode;
t. a ninth wire located within said housing unit connected to said third light emitting diode;
u. said seventh wire connected to a tenth wire;
v. said eighth wire connected to said tenth wire;
w. said ninth wire connected to said tenth wire;
x. said tenth wire connected to a metallic base of said female pocket socket;
y. said resistors all characterized by resistivity of 1.0 kilohms;
z. said light emitting diodes all characterized by optoelectric current carrying capacity of 10 milliamps.

4. An auto harness integrity tester, comprising:
a. a housing unit with three collinear holes in one end side of said housing unit with the other end of said housing unit being open;
b. a female socket pocket hole in said one end side adjacent only one of said three holes and collinear with said three holes;
c. a first male prong extending from within said housing unit through a first one of said three holes and fastened in place where said first prong so extends through said first hole;
d. a second male prong extending from within said housing unit through a second one of said three holes and fastened in place where said second prong so extends through said second hole;
e. a third male prong extending from within said housing unit through a third one or said three holes and fastened in place where said third prong so extends through said third hole;
f. a first wire within said housing unit and connected to the end of said first prong located inside said housing unit;
g. a second wire within said housing unit and connected to the end second prong located inside said housing unit;
h. a third wire within said housing unit and connected to the end of said third prong located inside said housing unit;
i. said first wire connected to a first end of a first light emitting diode located within and internally fastened within and to said housing unit;

j. said second wire connected to a first end of a second light emitting diode located within and internally fastened within and to said housing unit;

k. said third wire connected to a first end of a third light emitting diode located within and internally fastened within and to said housing unit;

l. a fourth wire connected to and leading from said first light emitting diode to a first end of a first resistor located within said housing unit;

m. a fifth wire connected to and leading from said second light emitting diode to a first end of a second resistor located within said housing unit;

n. a sixth wire connected to and leading from said third light emitting diode to a first end of a third resistor located within said housing unit;

o. a seventh wire located within said housing unit connected to and leading from said first resistor to and connected with a tenth wire;

p. an eighth wire located within said housing unit connected to and leading from said second resistor to and connected with a tenth wire;

q. a ninth wire located within said housing unit connected to and leading from said third resistor to and connected with a tenth wire;

r. said tenth wire connected to a metallic base of said female pocket socket;

s. said resistors all characterized by resistivity of 1.0 kilohms;

t. said light emitting diodes all characterized by optoelectric current carrying capacity of 10 milliamps.

5. The auto harness integrity tester of claim 1, whereby said resistors are characterized by resistivity within a range of 0.70 kilohms to 1.30 kilohms.

6. The auto harness integrity tester of claim 2, whereby said resistors are characterized by resistivity within a range of 0.70 kilohms to 1.30 kilohms.

7. The auto harness integrity tester of claim 3 whereby said resistors are characterized by resistivity within a range of 0.70 kilohms to 1.30 kilohms.

8. The auto harness integrity tester of claim 4 whereby said resistors are characterized by resistivity within a range of 0.70 kilohms to 1.30 kilohms.

9. The auto harness integrity tester of claim 1 whereby said first diode is one color, said second diode is of another color different from the color of said first diode and said third diode is of a third color different from said color of said first diode and said another color of said second diode.

10. The auto harness integrity tester of claim 2 whereby said first diode is one color, said second diode is of another color different from the color of said first diode and said third diode is of a third color different from said color of said first diode and said another color of said second diode.

11. The auto harness integrity tester of claim 3 whereby said first diode is one color, said second diode is of another color different from the color of said first diode and said third diode is of a third color different from said color of said first diode and said another color of said second diode.

* * * * *